(12) United States Patent
Kim et al.

(10) Patent No.: US 10,126,642 B2
(45) Date of Patent: Nov. 13, 2018

(54) REFLECTIVE PHOTOMASK, METHOD OF FABRICATING THE SAME, AND EXPOSURE APPARATUS USING THE REFLECTIVE PHOTOMASK

(71) Applicant: SAMSUNG ELECTRONICS CO., LTD., Suwon-si, Gyeonggi-do (KR)

(72) Inventors: Insung Kim, Seongnam-si (KR); Seongsue Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/285,543

(22) Filed: Oct. 5, 2016

(65) Prior Publication Data
US 2017/0108767 A1    Apr. 20, 2017

(30) Foreign Application Priority Data
Oct. 15, 2015    (KR) ......... 10-2015-0144152

(51) Int. Cl.
| | | |
|---|---|---|
| G03B 27/52 | (2006.01) | |
| G03B 27/42 | (2006.01) | |
| G03F 1/24  | (2012.01) | |
| G03F 1/54  | (2012.01) | |

(52) U.S. Cl.
CPC . *G03F 1/24* (2013.01); *G03F 1/54* (2013.01)

(58) Field of Classification Search
CPC ................................. G03F 1/54; G03F 1/24
See application file for complete search history.

(56) References Cited

U.S. PATENT DOCUMENTS

| | | | |
|---|---|---|---|
| 5,549,994 A * | 8/1996 | Watanabe | B82Y 10/00 378/34 |
| 5,928,817 A | 7/1999 | Yan et al. | |
| 5,935,737 A | 8/1999 | Yan | |
| 5,958,629 A | 9/1999 | Yan et al. | |
| 6,593,041 B2 | 7/2003 | Yan | |
| 6,607,862 B2 | 8/2003 | Yan et al. | |
| 6,986,971 B2 | 1/2006 | Han et al. | |
| 6,998,200 B2 | 2/2006 | Lee | |
| 8,153,349 B2 | 4/2012 | Cheon et al. | |
| 8,445,187 B2 | 5/2013 | Yoon et al. | |
| 8,764,995 B2 | 7/2014 | Chang et al. | |
| 2009/0263730 A1 * | 10/2009 | Kim | B82Y 10/00 430/5 |
| 2012/0045712 A1 | 2/2012 | Chang et al. | |
| 2012/0153511 A1 | 6/2012 | Song et al. | |
| 2013/0094084 A1 * | 4/2013 | Merrill | G02B 5/285 359/485.03 |
| 2013/0157177 A1 | 6/2013 | Yu et al. | |
| 2013/0162656 A1 * | 6/2013 | Holman | G02F 1/19 345/501 |
| 2014/0248555 A1 | 9/2014 | Chang et al. | |

(Continued)

FOREIGN PATENT DOCUMENTS

KR    1020030082819    10/2003

*Primary Examiner* — Mesfin Asfaw
(74) *Attorney, Agent, or Firm* — F. Chau & Associates, LLC

(57) ABSTRACT

Provided is a reflective photomask including a substrate, and a reflective layer formed on the substrate. The reflective layer includes at least one recessed portion. An absorbing layer is formed in the recessed portion. The absorbing layer includes at least one absorbent and at least one polymer.

16 Claims, 15 Drawing Sheets

(56) References Cited

U.S. PATENT DOCUMENTS

2014/0272681 A1 9/2014 Huang et al.
2015/0024305 A1 1/2015 Lu et al.
2016/0116835 A1* 4/2016 Kim .......................... G03F 1/24
                                                                    430/5

* cited by examiner

Heat

Heat

REFLECTIVE PHOTOMASK, METHOD OF FABRICATING THE SAME, AND EXPOSURE APPARATUS USING THE REFLECTIVE PHOTOMASK

CROSS-REFERENCE TO RELATED APPLICATION

This application claims priority under 35 U.S.C. § 119 to Korean Patent Application No. 10-2015-0144152 filed on Oct. 15, 2015, the disclosure of which is incorporated by reference herein in its entirety.

TECHNICAL FIELD

Exemplary embodiments of the present inventive concept relate to a reflective photomask, and more particularly to a method of fabricating the same, and an exposure apparatus including the same.

DISCUSSION OF RELATED ART

An extreme ultraviolet (EUV) photomask may include a substrate, a reflective layer, and an absorbing layer. The absorbing layer may be embedded in the reflective layer. When embedding the absorbing layer in the reflective layer, the absorbing layer may be embedded in the reflective layer through a deposition process, and then the absorbing layer on the reflective layer may be removed through dry etching or chemical mechanical polishing (CMP). When the absorbing layer is formed in the reflective layer using the deposition process and a dry etching or CMP process, a sufficient flatness might not be achieved, and particles generated when the absorbing layer is removed may remain on the reflective layer.

SUMMARY

One or more exemplary embodiments of the present inventive concept may provide a photomask capable of planarizing an EUV photomask, a method thereof, and an exposure apparatus including the photomask.

One or more exemplary embodiments of the present inventive concept may provide a photomask capable of reducing or eliminating defects of an EUV photomask, a method thereof, and an exposure apparatus including the photomask.

One or more exemplary embodiments of the present inventive concept may provide a photomask capable of using various materials as a material of an absorbing layer in an EUV photomask, a method thereof, and an exposure apparatus including the photomask.

According to an exemplary embodiment of the present inventive concept, a reflective photomask includes a substrate, and a reflective layer formed on the substrate. The reflective layer includes at least one recessed portion. An absorbing layer is formed in the recessed portion. The absorbing layer includes at least one absorbent and at least one polymer.

The at least one absorbent may include metallic particles. The metallic particles may include at least one selected from hafnium (Hf), tantalum (Ta), tungsten (W), aluminum (Al), and chromium (Cr).

The at least one absorbent may include a material which has an extinction coefficient (k) of about 0.02 or more among optical constants related to an extreme ultraviolet (EUV) light.

The polymer may include a compound having a structure in which a hydrogen atom of a phenolic hydroxyl group is replaced by a group having an arsenic acid-decomposable polycyclic type alicyclic hydrocarbon structure.

The reflective photomask may include a capping layer formed on the reflective layer and on the absorbing layer.

The capping layer may include at least one selected from silicon (Si), molybdenum (Mo), ruthenium (Ru), and zirconium (Zr).

The reflective photomask may include a hard mask layer on the reflective layer.

The hard mask layer may include ruthenium (Ru) or ruthenium silicon (RuSi).

The absorbing layer may include a surface which is thermally cured and wet etched.

According to an exemplary embodiment of the present inventive concept, a method of fabricating a reflective photomask includes, first, forming a reflective layer on a substrate. The method may include forming a recessed portion, and may include performing spin coating to form an absorbing layer, which includes an absorbent and a polymer, in the recessed portion and on the reflective layer. The method may include performing heat curing on the absorbing layer. The method may include removing the absorbing layer on an upper portion of the recessed portion and the reflective layer.

The heat curing on the absorbing layer may be performed within a temperature in which optical properties of the substrate and the absorbing layer are not changed.

The removing of the absorbent may include wet etching.

The method of fabricating the reflective photomask may include forming a capping layer on the reflective layer and on the absorbing layer.

The method of fabricating the reflective photomask may include forming a hard mask layer on the reflective layer.

According to an exemplary embodiment of the present inventive concept, an exposure apparatus includes an extreme ultraviolet (EUV) light generating device configured to generate and emit EUV light and a reflective photomask. The reflective photomask includes a substrate, a reflective layering including a recessed portion formed on the substrate, and an absorbing layer formed in the recessed portion. The absorbing layer includes an absorbent and a polymer. An illumination optical system is configured to direct the EUV light emitted from the EUV light generating device onto the reflective photomask. A projection optical system is configured to direct the EUV light reflected from the reflective photomask onto a target object.

The absorbent may include a material which has an extinction coefficient (k) of about 0.02 or more among optical constants related to the EUV light.

The polymer may include a compound having a structure in which a hydrogen atom of a phenolic hydroxyl group is replaced by a group having an arsenic acid-decomposable polycyclic type alicyclic hydrocarbon structure.

The reflective photomask may include a capping layer disposed on the reflective layer and on the absorbing layer.

The reflective photomask may include a hard mask layer disposed on the reflective layer.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

Figure 1:
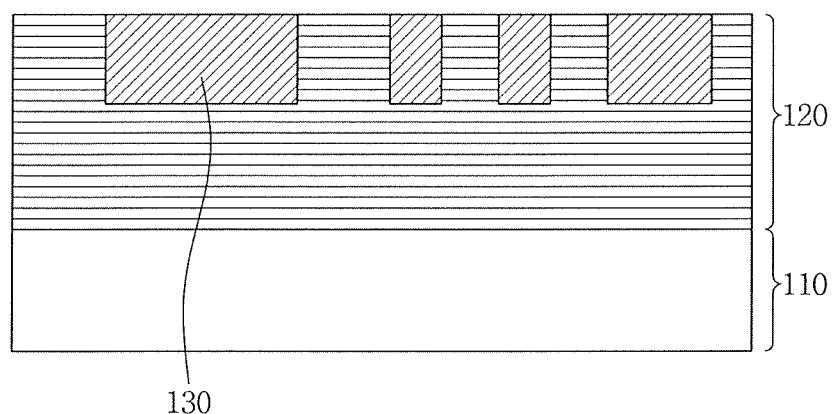
FIG. 1 is a cross-sectional view illustrating a reflective photomask according to an exemplary embodiment of the present inventive concept.

Various exemplary embodiments of the present inventive concept will be described in more detail below with reference to the accompanying drawings in which some exemplary embodiments of the present inventive concept are shown. Exemplary embodiments of the present inventive concept may, however, be embodied in many different forms and should not be construed as being limited to the embodiments set forth herein.

It will be understood that when a first element is referred to as being "on" a second element, the first element may be directly on the second element, or a third element may be disposed between the first element and the second element. In the drawings, the lengths and thicknesses of layers and regions may be exaggerated for clarity. Variations from the shapes of the illustrations as a result, for example, of manufacturing techniques and/or tolerances, may occur. Thus, exemplary embodiments of the present inventive concept should not be construed as limited to the particular shapes of regions illustrated herein but are to include deviations in shapes that result, for example, from manufacturing.

Regions illustrated in the drawings may be schematic in nature, and their shapes are not intended to limit the present inventive concept.

The terminology used herein may be used to describe particular embodiments of the present inventive concept and is not intended to be limiting of the present inventive concept. As used herein, the singular forms may include the plural forms as well.

Exemplary embodiments of the present inventive concept will be described in more detail below with reference to the accompanying drawings.

FIG. 1 is a cross-sectional view illustrating a reflective photomask according to an exemplary embodiment of the present inventive concept.

Referring to FIG. 1, a reflective photomask 100 according to an exemplary embodiment of the present inventive concept may include a substrate 110, a reflective layer 120, and an absorbing layer 130.

The substrate 110 may include a dielectric, glass, a semiconductor or a metallic material. The substrate 110 may include a material having a low thermal expansion coefficient. For example, the substrate 110 may have a thermal expansion coefficient of about $0\pm0.05\times10^{-7}/°$ C. at 20° C. The substrate 110 may include a material having relatively high smoothness, relatively high flatness, and relatively high resistance to a cleaning solvent. For example, the substrate 110 may include a low thermal expansion material (LTEM) glass such as a synthetic quartz glass, a quartz glass, an aluminosilicate glass, a soda-lime glass, or a silicon dioxide-titanium dioxide ($SiO_2$—$TiO_2$) based glass, a crystalized glass of an extracted β-quartz solid solution, a single crystalline silicon, or silicon carbide (SiC).

The reflective layer 120 may be disposed on the substrate 110. The reflective layer 120 may have a multi-layer mirror structure in which a layer of high refractive index and a layer of low refractive index are alternately stacked one or more times. For example, the reflective layer 120 may have a structure in which the layer of high refractive index and the layer of low refractive index are repeatedly formed in approximately 40 to 60 cycles. The top layer of the reflective layer 120 may be a high refractive index layer.

The reflective layer 120 may include multiple layers including molybdenum and silicon (Mo/Si), multiple layers including a Mo compound and a Si compound, multiple layers including ruthenium and silicon (Ru/Si), multiple layers including beryllium and molybdenum (Be/Mo), multiple layers including silicon and niobium (Si/Nb), multiple layers including silicon, molybdenum and ruthenium (Si/Mo/Ru), multiple layers including silicon, molybdenum, ruthenium and molybdenum (Si/Mo/Ru/Mo), or multiple layers including silicon, ruthenium, molybdenum and ruthenium (Si/Ru/Mo/Ru).

A material and thickness of each layer of the reflective layer 120 may be selected according to a wavelength of extreme ultraviolet (EUV) light, or reflectivity of the EUV light desired in the reflective layer 120. For example, when the reflective layer 120 includes multiple layers including Mo/Si, each of the Mo layers which are layers of low refractive index, and each of the Si layers which are layers of high refractive index may have a thickness ranging from about 2 nm to about 5 nm.

The reflective layer 120 may include recessed portions. The recessed portions may be closed in a direction facing the substrate 110 and may be open in a direction facing away from the substrate. The recessed portions may be a predetermined pattern transferred to a wafer. The recessed portion may have various depths according to an absorption rate of an absorbent embedded in the recessed portion with respect to the EUV light. That is, when the absorption rate of the absorbent is relatively high with respect to the EUV light, the recessed portion may be relatively shallow, and when the absorption rate of the absorbent is relatively low with respect to the EUV light, the recessed portion may be relatively deep. The recessed portion may have a depth ranging from about 30 nm to about 200 nm.

The absorbing layer 130 may be formed in the recessed portion of the reflective layer 120. The absorbing layer 130 may absorb EUV light, and may include a material having a very low reflectivity to EUV light. The absorbing layer 130 may include a material having a relatively high chemical resistance.

The absorbing layer 130 may be formed by a spin coating method, and thus may include materials used in the spin coating. The materials of the spin coating may be viscous materials including a solvent, an absorbent, and/or a polymer. When thermal curing is performed after the spin coating, the solvent may be removed, and the absorbent and the polymer may be cured and remain in the recessed portion.

The absorbing layer 130 may include metallic particles as the absorbent. The metallic particles may be nanosized. The absorbing layer 130 may include a material having a very low maximum light reflectivity (e.g., equal to or less than about 0.5%) to light of about 13.5 nm, which is a wavelength in the EUV light region. The absorbing layer 130 may include hafnium (Hf), tantalum (Ta), tungsten (W), aluminum (Al), or chromium (Cr). The absorbing layer 130 may include mixtures of these metals or mixtures of these metals and other metals. For example, when Ta is a main component, the absorbing layer 130 may include Ta, the main component, and at least one of hafnium (Hf), silicon (Si), zirconium (Zr), germanium (Ge), boron (B), nitrogen (N), and hydrogen (H). For example, the absorbing layer 130 may include TaO, TaN, TaHf, TaHfN, TaBSi, TaBSiN, TaB, TaBN, TaSi, TaSiN, TaGe, TaGeN, TaZr, TaZrN, or a combination thereof.

The absorbent of the absorbing layer 130 may include a material which has an extinction coefficient (k) of about 0.02 or more among optical constants related to the EUV light.

The absorbing layer 130 may include a polymer.

The polymer may include a compound having a structure in which a hydrogen atom of a phenolic hydroxyl group is replaced by a group having an arsenic acid-decomposable polycyclic type alicyclic hydrocarbon structure. The polymer may include a repeating unit represented by the following Expression 1:

(Expression 1)

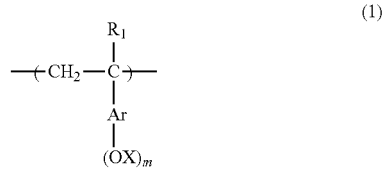

(1)

In Expression 1, R1 denotes a hydrogen atom or a methyl group, X denotes a group having an arsenic acid-decomposable polycyclic type alicyclic hydrocarbon structure, Ar denotes an aromatic ring, and m denotes an integer equal to or greater than 1.

The polymer may include an alkali-soluble resin. A novolac resin may be used as the alkali-soluble resin. The novolac resin may be obtained by an addition-condensation reaction of a phenol compound and an aldehyde compound. The phenol compound may be a phenol, o-cresol, m-cresol, p-cresol, 2,5-xylenol, 3,5-xylenol, 3,4-xylenol, 2,3,5-trimethylphenol, 4-t-butylphenol, 2-t-butylphenol, 3-t-butylphenol, 3-ethylphenol, 2-ethylphenol, 4-ethylphenol, 3-methyl-6-t-butylphenol, 4-methyl-2-t-butylphenol, 2-naphthol, 1,3-dihydroxynaphthalene, 1,7-dihydroxynaphthalene, 1,5-dihydroxynaphthalene. Each may be used alone or in mixtures thereof. The aldehyde compound may be formaldehyde, paraformaldehyde, acetaldehyde, propylaldehyde, benzaldehyde, phenylaldehyde, α-phenylpropylaldehyde, β-phenylpropylaldehyde, o-hydroxybenzaldehyde, m-hydroxybenzaldehyde, p-hydroxybenzaldehyde, glutaraldehyde, glyoxal, o-methylbenzaldehyde, or p-methylbenzaldehyde. Each may be used alone or in mixtures thereof.

The absorbing layer 130 may have a surface roughness of having a height variability of about 0.5 nm or less. When the surface roughness of the absorbing layer 130 is relatively high, an edge roughness of a pattern formed on the absorbing layer 130 may become relatively high, and thus dimensional accuracy of a pattern may be deteriorated. As the pattern becomes minute, the effect of the edge roughness may increase, thus the surface of the absorbing layer 130 is required to be flat. When the surface roughness of the absorbing layer 130 has a height variability of about 0.5 nm or less, the surface of the absorbing layer 130 may be sufficiently flat, and thus a deterioration in the dimensional accuracy of a pattern may be reduced or eliminated.

The absorbing layer 130 may be a spin-coated type layer in which an absorbent including metallic nanoparticles and a polymer are thermally cured.

The upper surface of the absorbing layer 130 may be removed by wet etching, and thus may have an open surface etched by the wet etching.

Figure 2:
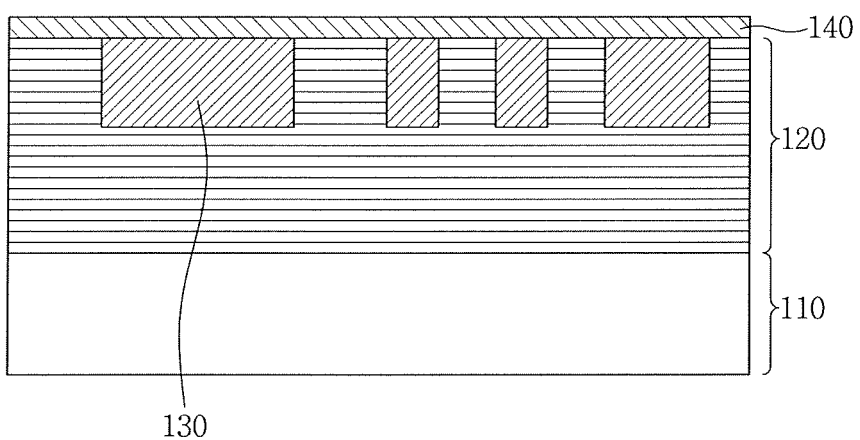
FIG. 2 is a cross-sectional view illustrating a reflective photomask according to an exemplary embodiment of the present inventive concept.

FIG. 2 is a cross-sectional view illustrating a reflective photomask according to an exemplary embodiment of the present inventive concept.

Referring to FIG. 2, a reflective photomask 200 according to an exemplary embodiment of the present inventive concept may include the substrate 110, the reflective layer 120, the absorbing layer 130, and a capping layer 140.

The substrate 110 may include a dielectric, glass, a semiconductor or a metallic material. The substrate 110 described with reference to FIG. 2 may be substantially the same as the substrate described with reference to FIG. 1, and thus duplicative descriptions may be omitted.

The reflective layer 120 may be disposed on the substrate 110, and may have recessed portions. The reflective layer 120 described with reference to FIG. 2 may be substantially the same as the reflective layer 120 described with reference to FIG. 1, and thus duplicative descriptions may be omitted.

The absorbing layer 130 may be formed in the recessed portions of the reflective layer 120, formed by a spin coating method, and may include an absorbent including metallic particles and a polymer. The absorbing layer 130 described with reference to FIG. 2 may be substantially the same as the absorbing layer 130 described with reference to FIG. 1, and thus duplicative descriptions may be omitted.

The capping layer 140 may be disposed on the reflective layer 120 and on the absorbing layer 130. The capping layer 140 may include a material selected from silicon (Si), molybdenum (Mo), ruthenium (Ru), and zirconium (Zr). The capping layer 140 may include a nitride of a transition metal or an oxynitride of the transition metal. For example, the capping layer 140 may include ruthenium nitride (RuN) including Ru and N, or ruthenium oxynitride (RuON) including Ru, O and N.

The capping layer 140 may reduce or prevent the reflective layer 120 from being degraded or damaged by an unwanted oxide film grown due to oxygen penetration. The capping layer 140 may increase durability of a reflective photomask with respect to repeated cleaning processes in subsequent processes, and thus a lifetime of the reflective photomask may be extended.

The capping layer 140 may have a thickness about 2.5 nm or less.

Figure 3:
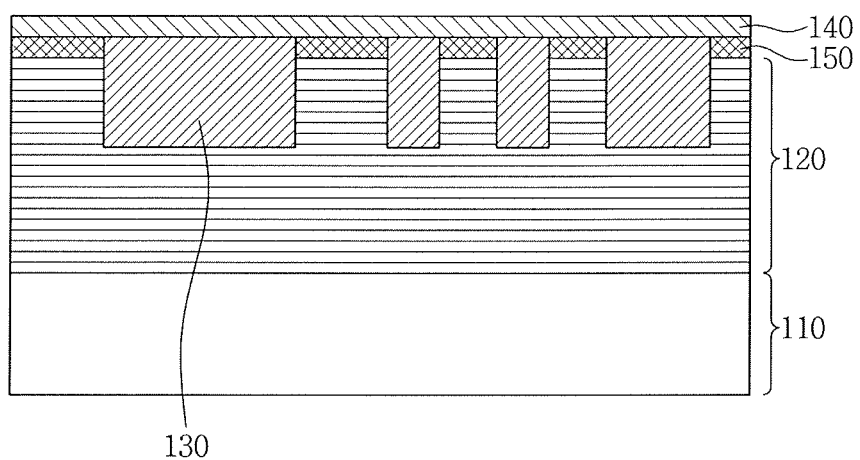
FIG. 3 is a cross-sectional view illustrating a reflective photomask according to an exemplary embodiment of the present inventive concept.

FIG. 3 is a cross-sectional view illustrating a reflective photomask according to an exemplary embodiment of the present inventive concept.

Referring to FIG. 3, a reflective photomask 300 according to an exemplary embodiment of the present inventive concept may include the substrate 110, the reflective layer 120, the absorbing layer 130, the capping layer 140 and a hard mask layer 150.

The substrate 110 may include a dielectric, glass, a semiconductor or a metallic material. The substrate 110 described with reference to FIG. 3 may be substantially the same as the substrate 110 described with reference to FIG. 1, and thus duplicative descriptions may be omitted.

The reflective layer 120 may be disposed on the substrate 110, and may have recessed portions. The reflective layer 120 described with reference to FIG. 3 may be substantially the same as the reflective layer 120 described with reference to FIG. 1, and thus duplicative descriptions may be omitted.

The absorbing layer 130 may be formed in the recessed portions of the reflective layer 120, formed by a spin coating method, and may include an absorbent of metallic particles and a polymer. The absorbing layer 130 described with reference to FIG. 3 may be substantially the same as the absorbing layer 130 described with reference to FIG. 1, and thus duplicative descriptions may be omitted.

The hard mask layer 150 may reduce or prevent the reflective layer 120 from being damaged when the recessed portions are formed in the reflective layer 120.

The hard mask layer 150 may serve as an etch stop layer for pattern formation when the recessed portions are formed in the reflective layer 120. When the recessed portions are formed in the reflective layer 120, a photoresist layer may be removed and only the hard mask layer 150 may be used after the hard mask layer 150 is patterned using a patterned photoresist layer.

The hard mask layer 150 may reduce or prevent a surface of the reflective layer 120 from being oxidized.

The hard mask layer 150 may include a material having a very low absorption rate of the EUV light. The hard mask layer 150 may include at least one transition material selected from ruthenium (Ru), nickel (Ni), and iridium (Ir). In some exemplary embodiments of the present inventive concept, the hard mask layer 150 may include RuB, RuSi, chromium (Cr), chromium nitride, aluminum (Al), aluminum nitride, Ta, tantalum nitride, platinum (Pt), palladium (Pd), $SiO_2$, $Si_3N_4$, $Al_2O_3$, or a combination thereof.

The hard mask layer 150 may be thicker than a layer of high refractive index which forms the top layer of the reflective layer 120. The hard mask layer 150 may have a thickness ranging from about 1 nm to about 6 nm. For example, a layer of high refractive index forming the top layer of the reflective layer 120 may have a thickness ranging from about 1.5 nm to about 2.5 nm, and the hard mask layer 150 may have a thickness ranging from about 3 nm to about 6 nm.

In the embodiment of FIG. 3, the capping layer 140 described with reference to FIG. 2 may be disposed on the reflective layer 120 and the absorbing layer 130. In certain embodiments, unlike FIG. 3, the capping layer 140 may be omitted.

FIGS. 4A to 4I are cross-sectional views illustrating a method of fabricating a reflective photomask according to an exemplary embodiment of the present inventive concept.

Figure 4A:
FIGS. 4A to 4I are cross-sectional views illustrating a method of fabricating a reflective photomask according to an exemplary embodiment of the present inventive concept.

Referring to FIG. 4A, a substrate 210 may be prepared. The substrate 210 may include a dielectric, glass, a semiconductor or a metallic material.

Figure 4B:
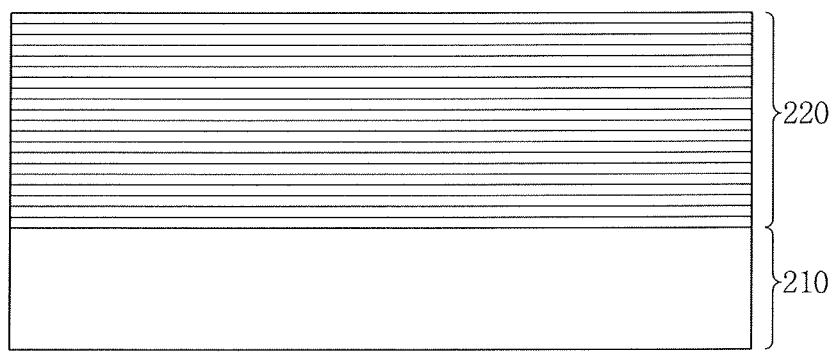

Referring to FIG. 4B, a reflective layer 220 may be formed on the substrate 210. The reflective layer 220 may be formed using a direct current (DC) sputtering process, radio frequency (RF) sputtering process, or ion-beam sputtering process. For example, when multiple layers of a Mo/Si reflective layer are formed using the ion-beam sputtering, the Mo layer and the Si layer may be formed in approximately 40 to 60 cycles when one cycle includes deposition of a Si layer using an Si target as a target and argon (Ar) gas as a sputtering gas, and deposition of a Mo layer using an Mo target as a target and Ar gas as a sputtering gas. The uppermost layer of the multiple layers of the reflective layer 220 may include a Si layer which is a layer having a high refractive index.

Figure 4C:
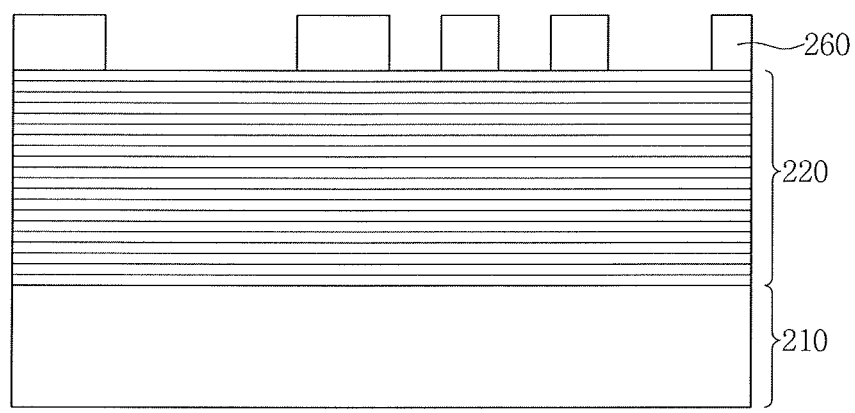

Referring to FIG. 4C, a photoresist layer 260 may be formed on the reflective layer 220. The photoresist layer 260 may be patterned through an exposure process and formed on the reflective layer 220. The photoresist layer 260 may have the shape as shown in FIG. 4C, however, exemplary embodiments of the present inventive concept are not limited thereto, and the photoresist layer 260 may have other shapes, as desired.

Figure 4D:
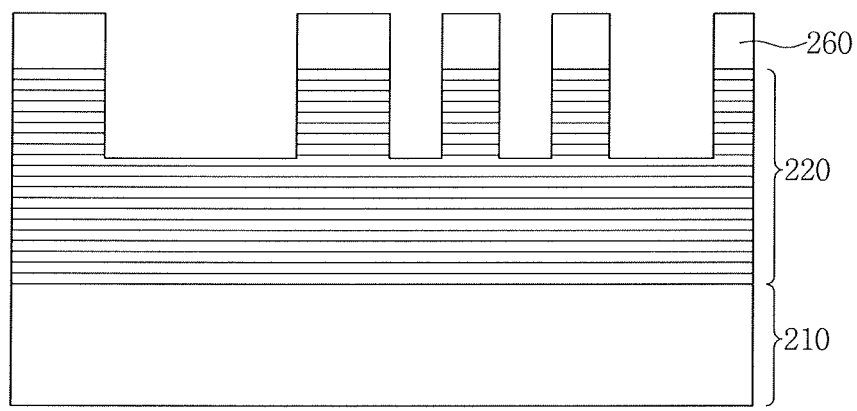

Referring to FIG. 4D, the reflective layer 220 may be etched and a plurality of recessed portions may be formed based on a pattern of the photoresist layer 260. The reflective layer 220 may be etched by dry etching. $Cl_2$, $F_2$, or a mixture thereof may be used to etch the reflective layer 220. The recessed portions of the reflective layer 220 may be etched to a depth of about 10 nm to about 150 nm.

Figure 4E:
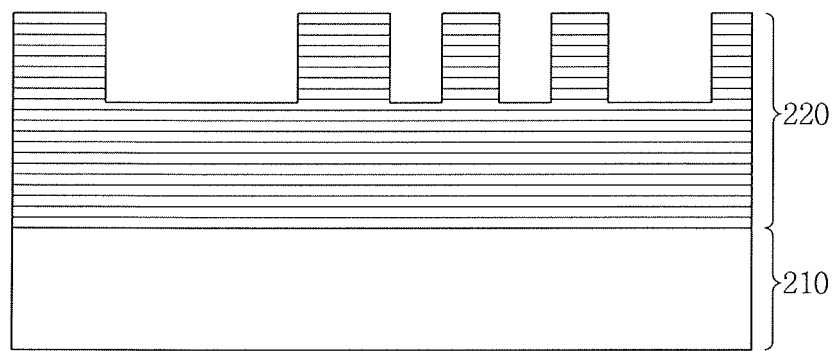

Referring to FIG. 4E, the photoresist layer 260 on the reflective layer 220 may be removed. $H_2SO_4$ or $O_3$ may be used to remove the photoresist layer 260. When $H_2SO_4$ is used, the photoresist layer 260 may be immersed in dilute sulfuric acid in which $H_2SO_4$, and water or another solvent are mixed to form an $H_2SO_4$ solution. The $H_2SO_4$ solution may be heated to several tens of degrees Celsius to increase reactivity. When $H_2SO_4$ is used, a process of complete cleaning with a neutral or alkaline cleaning solvent may be performed. For example, a cleaning solvent including water, hydrogen peroxide, or ammonium may be used. When $O_3$ is used, the photoresist layer 260 may be exposed to $O_3$ gas in a vapor state. When exposed to the $O_3$ gas, the photoresist layer 260 may be changed to being water-soluble. The internal atmospheric pressure of a reaction chamber may be about 76 kPa, and the temperature of an inside of the reaction chamber may be about 105° C. A vaporization pressure of the $O_3$ gas may be about 95 kPa, and the temperature of a vaporized $O_3$ gas may be about 136° C. Reaction time may be different according to the materials included in the photoresist layer. The photoresist layer 260 changed to being water-soluble may be removed using water.

Figure 4F:
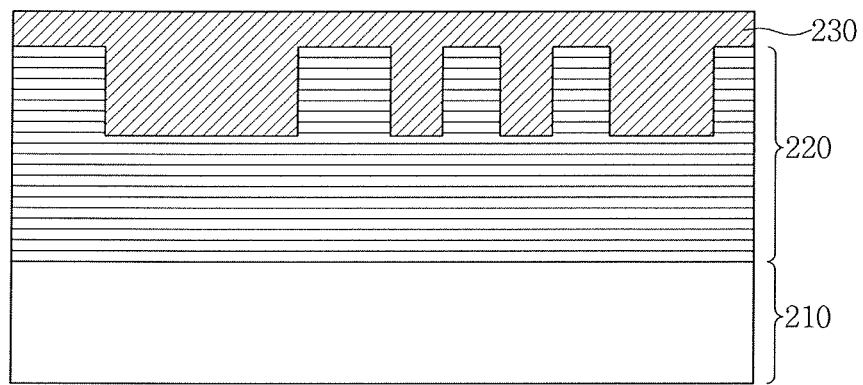

Referring to FIG. 4F, an absorbing layer 230 may be formed in the recessed portions of the reflective layer 220. The absorbing layer 230 may be formed by a spin coating method. The material of the spin coating may include a solvent, an absorbent, and/or a polymer.

Any solvent which can evaporate after the absorbing layer 230 is embedded in the recessed portions of the reflective layer 220 and form a uniform and flat absorbing layer 230 can be used. For example, ethyleneglycol monomethylethyl, ethyleneglycol monoethylether, ethyleneglycol monomethylether, diethyleneglycol monoethylether, propyleneglycol monomethylether acetate (PGMEA), toluene, xylene, methylethylketone, cyclohexanone, 2-hydroxypropionethyl, 2-hydroxy 2-methylpropionic acid ethyl, ethoxy acetic acid ethyl, hydroxy acetic acid ethyl, 2-hydroxy 3-methylbutanoic acid methyl, 3-methoxy 2-methylpropionic acid methyl, 3-ethylpropionic acid ethyl, 3-methoxy 2-methylpropionic acid ethyl, acetic acid ethyl, acetic acid butyl, or a mixture thereof may be used.

The content of the solvent may range from about 300 parts by weight to about 5000 parts by weight for 100 parts by weight of the polymer.

The polymer may include a compound having a structure in which a hydrogen atom of a phenolic hydroxyl group is replaced by a group having an arsenic acid-decomposable polycyclic type alicyclic hydrocarbon structure. The polymer may include a repeating unit represented by the above Expression 1.

In Expression 1, examples of the aromatic ring denoted by Ar may include an aromatic hydrocarbon ring and an aromatic heteroring.

The aromatic hydrocarbon ring includes 6 to 18 carbon atoms, and may have a substituent group such as a benzene ring, a naphthalene ring, an anthracene ring, a fluorene ring, or a phenanthrene ring. The aromatic heteroring may include a heterocyclic ring such as a thiophene ring, a furan ring, a pyrrol ring, a benzothiophene ring, a benzofuran ring, a benzopyrrol ring, a triazin ring, an imidazole ring, a benzimidazole ring, a triazole ring, a thiadiazole ring, or a thiazole ring.

The aromatic ring of Ar may include a substituent group except the group represented as OX, and examples of the substituent group may include an alkyl group (e.g., having 1 to 6 carbon atoms), a cycloalkyl group (e.g., having 3 to 10 carbon atoms), an aryl group (e.g., having 6 to 15 carbon atoms), a halogen atom, a hydroxyl group, an alkoxy group (e.g., having 1 to 6 carbon atoms), a carboxyl group, or and an alkoxycarbonyl group (e.g., having 2 to 7 carbon atoms).

The polycyclic type alicyclic hydrocarbon structure, for example, may include a bicyclic structure, a tricyclic structure, and a tetracyclic structure, each of them including 5 or more carbon atoms. The polycyclic type alicyclic hydrocarbon structure may include a polycyclic type cyclic structure which has 6 to 30 carbon atoms. Examples of the polycyclic type cyclic structure may include an adamantine structure, a decaline structure, a norbornane structure, a norbornene structure, a cedrol structure, an isobornane structure, a bornane structure, a dicyclopentane structure, an α-pinene structure, a tricyclodecane structure, a tetracyclodecane structure, and an androstane structure.

The absorbent, for example, may include hafnium (Hf), tantalum (Ta), tungsten (W), aluminum (Al), or chromium (Cr). The absorbent may include metallic particles which may be mixed with the solvent.

A spin coating device used in the spin coating method described herein may include a photomask, a photomask supporting unit, a coating material spraying unit, a nozzle driving unit, and a control unit. A nozzle may move from a center area to an edge area of the photomask, and may substantially simultaneously discharge a spin coating material. The nozzle may move at a speed ranging from about 100 nm/s to about 200 nm/s. A discharge rate of the spin coating material may range from about 0.4 cc/s to about 1.0 cc/s.

Figure 4G:
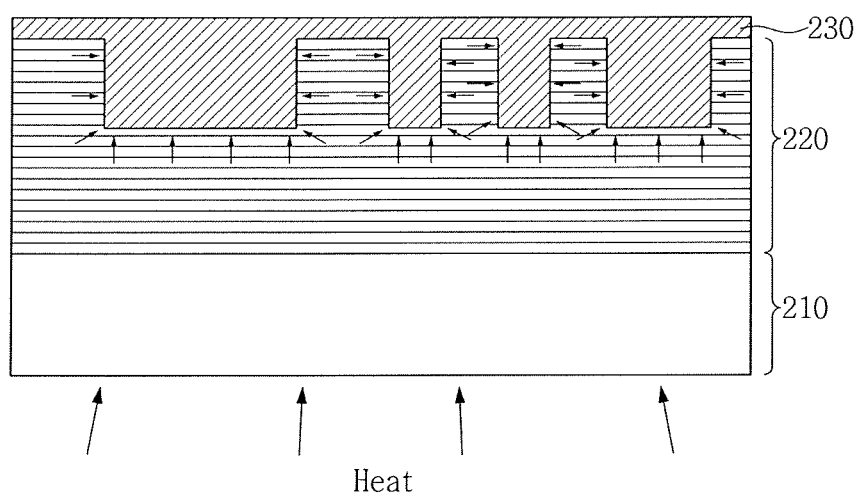

Referring to FIG. 4G, heat may be applied to materials in the recessed portions of the reflective layer 220 and on an upper surface of the reflective layer 220. The applied heat may have a temperature which does not change an optical property of the substrate 210 or the reflective layer 220, and the temperature may be equal to or lower than about 200° C.

The heat may be applied from a direction of the substrate 210. The heat may be concentrated in the recessed portions. The spin coating material in the recessed portions of the reflective layer 220 may be relatively firmly cured, and the spin coating material on the upper surface of the reflective layer 220 may be relatively slightly cured.

The volume of the spin coating material on the upper surface of the reflective layer 220 may be decreased because the solvent may be evaporated during a thermal process.

An electromagnetic wave may be used for thermal treatment of FIG. 4G. For example, the electromagnetic wave may have a wavelength ranging from about 100 nm to about 1000 nm. The electromagnetic wave may be supplied by an infrared lamp, a solid-state laser, a Ni—Cr hot wire, a ceramic heater, or a quartz heater. For example, a device for generating the electromagnetic wave may include a Xe lamp, a Xe—Hg lamp, the ceramic heater, the quartz heater, a diode laser light having an oscillating wavelength of 808 nm, a transparent quartz infrared heater lamp, and a combination thereof.

Figure 4H:
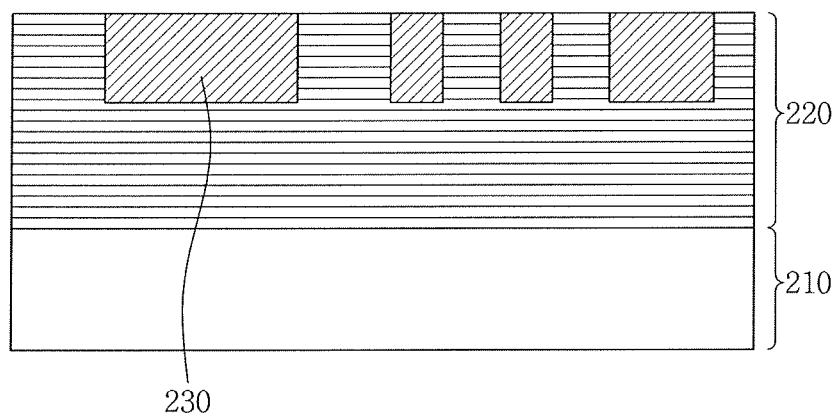

Referring to FIG. 4H, the spin coating material coated on the upper surface of the reflective layer 220 and on an upper portions of the recessed portions except insides of the recessed portions may be removed. The spin coating material on the upper surface of the reflective layer 220 and on the upper portions of the recessed portions may be in a state of slightly cured by heat. The slightly cured spin coating material may be removed by wet etching. When the spin coating material is removed by the wet etching, the spin coating material on the upper surface of the reflective layer 220 and on the upper portions of the recessed portions may be removed while maintaining relatively highly flat upper surfaces of the reflective layer 220 and the absorbing layer 230. When the spin coating material is removed by the wet etching, it is possible to reduce or prevent residual particles from remaining on the upper surface of the reflective layer 220.

Figure 4I:
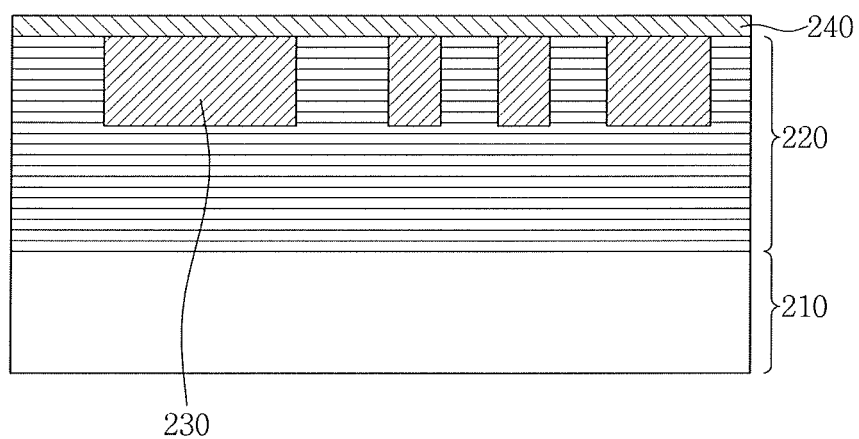

Referring to FIG. 4I, a capping layer 240 may be formed on the reflective layer 220 and on the absorbing layer 230. The capping layer 240 may include silicon (Si), molybdenum (Mo), ruthenium (Ru), zirconium (Zr). The capping layer 240 may be formed using chemical vapor deposition (CVD), physical vapor deposition (PVD), atomic layer deposition (ALD), or sputtering.

FIGS. 5A to 5K are cross-sectional views illustrating a method of fabricating a reflective photomask according to an exemplary embodiment of the present inventive concept.

Figure 5A:
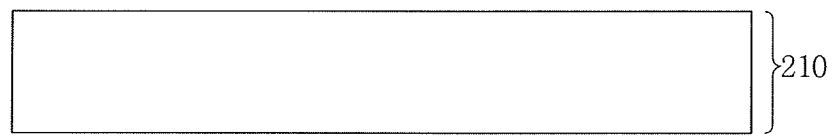
FIGS. 5A to 5K are cross-sectional views illustrating a method of fabricating a reflective photomask according to an exemplary embodiment of the present inventive concept.

Referring to FIG. 5A, the substrate 210 may be prepared.

Figure 5B:
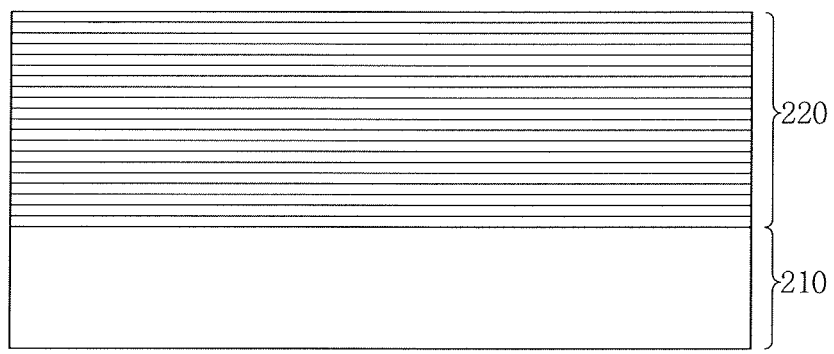

Referring to FIG. 5B, the reflective layer 220 may be formed on the substrate 210.

The processes of FIGS. 5A and 5B may be substantially the same as the processes described with reference to FIGS. 4A and 4B and thus duplicative descriptions may be omitted.

Figure 5C:
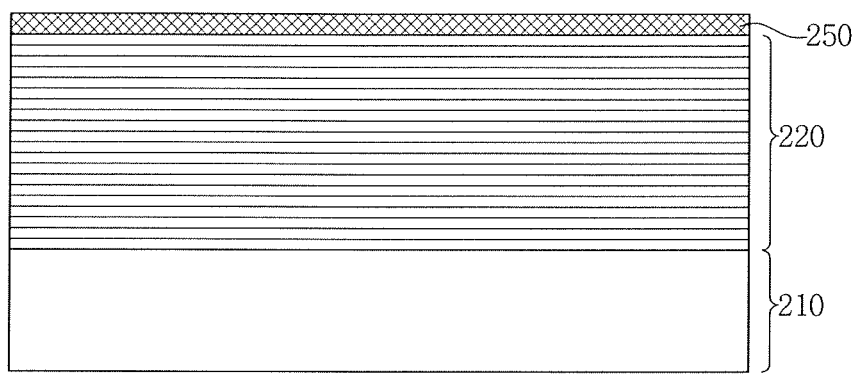

Referring to FIG. 5C, a hard mask layer 250 may be formed on the reflective layer 220. The hard mask layer 250 may include Ru or RuSi. The hard mask layer 250 may be formed using CVD, PVD, ALD, or sputtering.

When the hard mask layer 250 is formed using a sputtering process, a magnetron sputtering process in which Ru is used as a target and Ar is used as a sputtering gas may be performed. The hard mask layer 250 may be formed to have a thickness ranging from about 1 nm to about 100 nm.

Figure 5D:
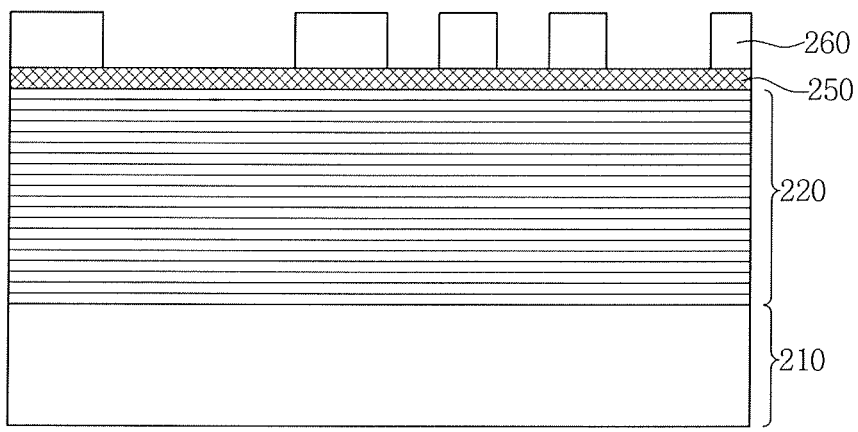

Referring to FIG. 5D, the photoresist layer 260 may be formed on the hard mask layer 250. The photoresist layer 260 may be patterned through an exposure process and formed on the hard mask layer 250. The photoresist layer 260 may have the shape as shown in FIG. 5D, however, exemplary embodiments of the present inventive concept are not limited thereto, and the photoresist layer 260 may have other shapes, as desired.

Figure 5E:
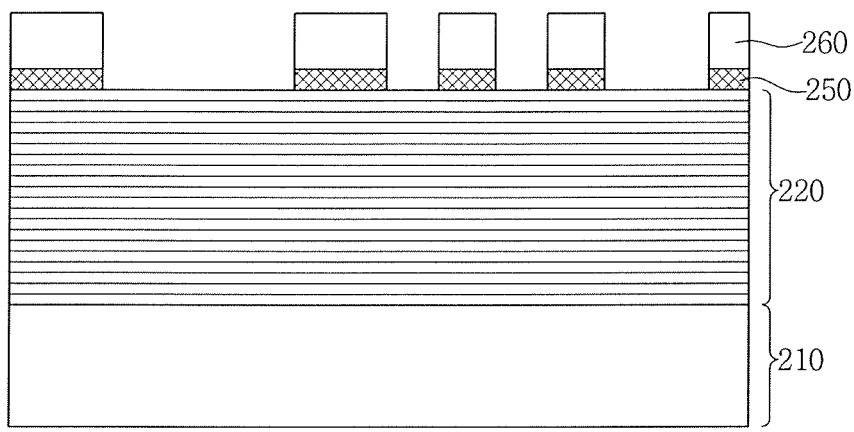

Referring to FIG. 5E, the hard mask layer 250 may be patterned based on the pattern of the photoresist layer 260. The patterning of the hard mask layer 250 may be performed by dry etching.

Figure 5F:
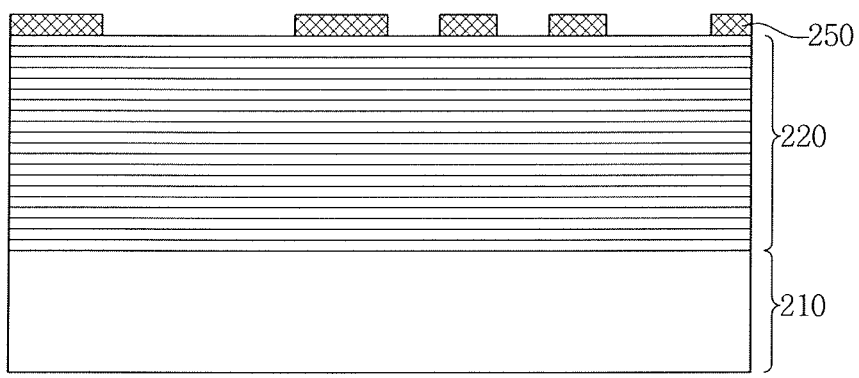

Referring to FIG. 5F, the photoresist layer 260 may be removed. $H_2SO_4$ or $O_3$ may be used to remove the photoresist layer 260.

When the hard mask layer 250 is not used as a main etch stop layer and the photoresist layer 260 is used as the main etch stop layer, the photoresist layer 260 might not be removed.

Figure 5G:
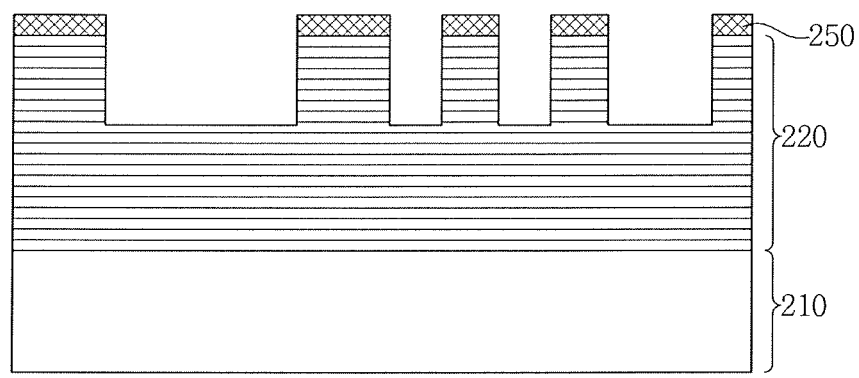

Referring to FIG. 5G, the reflective layer 220 may be etched using the hard mask layer 250 as the etch stop layer to form the recessed portions. The reflective layer 220 may be etched by dry etching. $Cl_2$, $F_2$, or a mixture thereof may be used to etch the reflective layer 220. However, when there is even a possibility that the hard mask layer 250 might be etched, another suitable etching material may be selected and used.

Figure 5H:
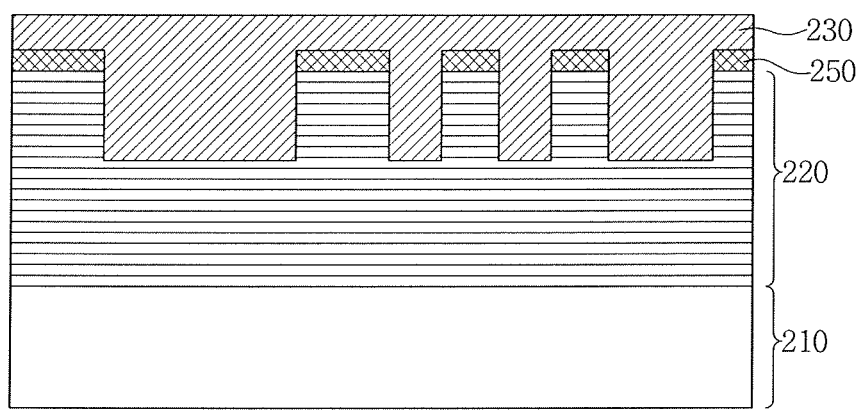
Figure 5I:
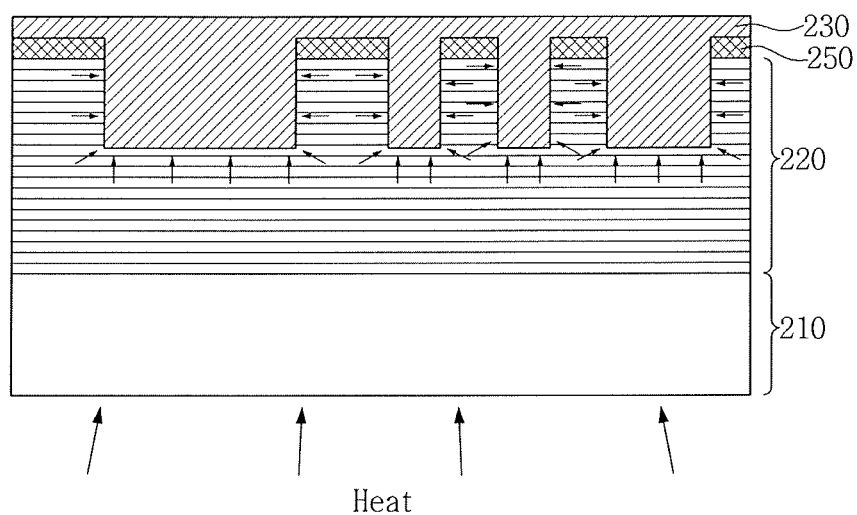
Figure 5J:
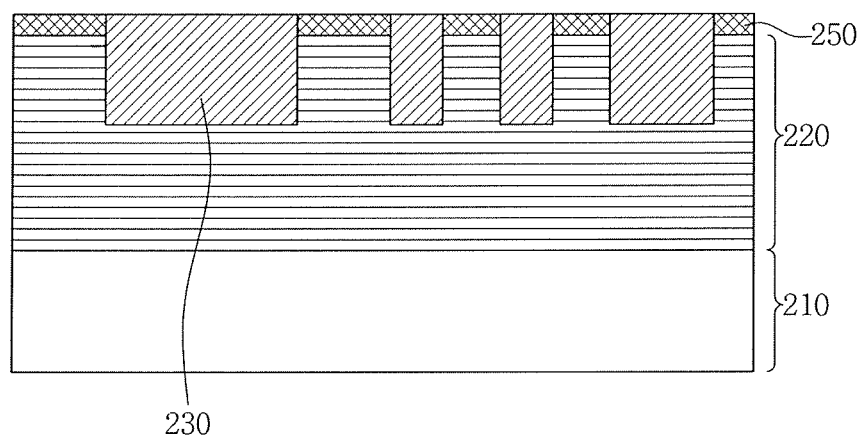

Referring to FIG. 5H, the absorbing layer 230 may be formed in the recessed portions formed by the hard mask layer 250. The absorbing layer 230 may be formed by a spin coating method. The material of the spin coating may include a solvent, an absorbent, and/or a polymer. The process of spin coating described with reference to FIG. 5H may be substantially the same as the process of spin coating described with reference to FIG. 4F, and thus duplicative descriptions may be omitted.

Figure 5K:
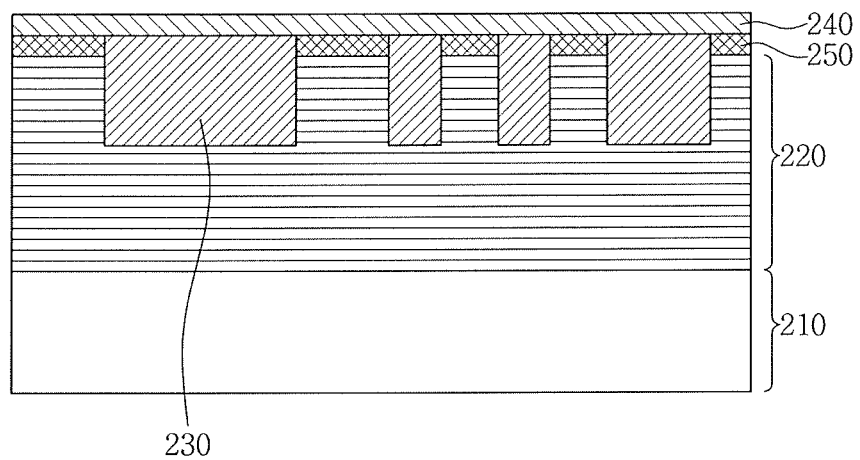

The absorbing layer 230 may be heated to generate a solubility difference (see, e.g., FIG. 5I), the upper portion of the absorbing layer 230 may be removed by wet etching (see, e.g., FIG. 5J), and the capping layer 240 may be formed in the upper portion of the absorbing layer 230 (see, e.g., FIG. 5K). The processes of heating of the absorbing layer 230, the removal of a part of the absorbing layer 230, and the formation of the capping layer 240 described with reference to FIGS. 5I to 5K may be substantially the same as the processes described with reference to FIGS. 4G to 4I, except the structure added by the hard mask layer 250 on the reflective layer 220, and thus duplicative descriptions may be omitted.

Figure 6:
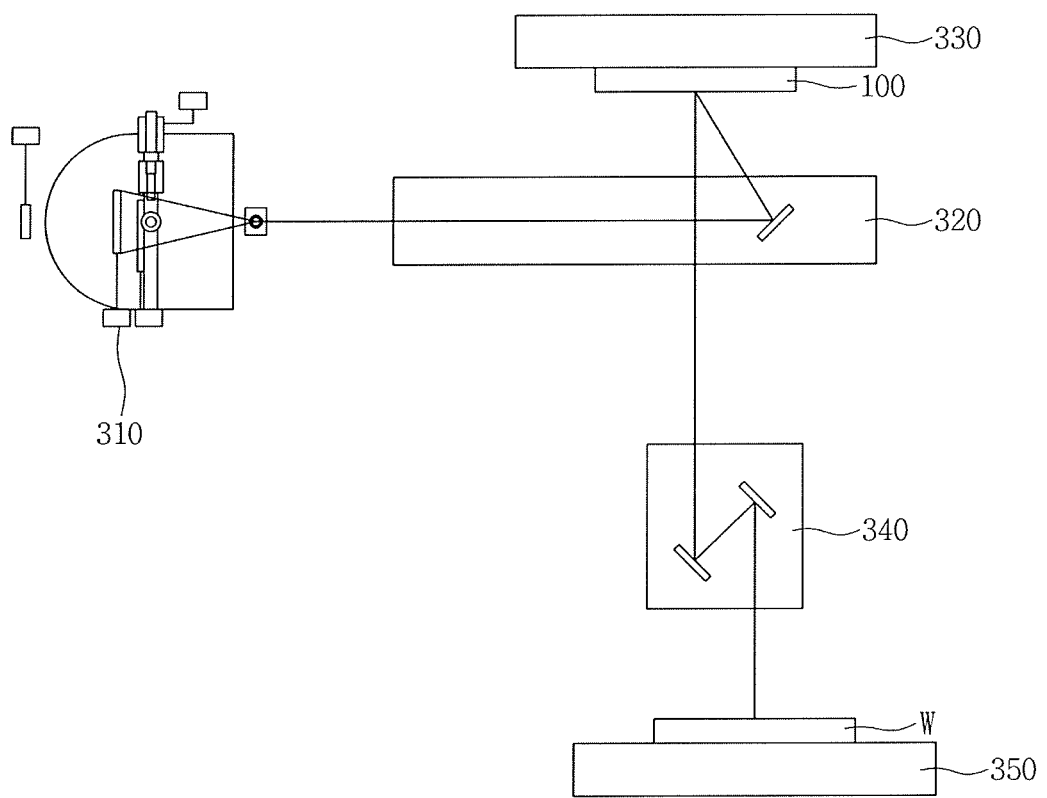
FIG. 6 is a diagram illustrating an exposure apparatus using a reflective photomask according to an exemplary embodiment of the present inventive concept.

FIG. 6 is a diagram illustrating an exposure apparatus using a reflective photomask according to an exemplary embodiment of the present inventive concept.

Referring to FIG. 6, an exposure apparatus according to an exemplary embodiment of the present inventive concept may include an EUV light generating device 310, an illumination optical system 320, a mask stage 330, a projection optical system 340, and a wafer stage 350.

The EUV light generating device 310 may include a chamber, a material supplying unit, a laser irradiating unit, a light collecting unit, and a guide unit.

The chamber may have an internal space in which the EUV light is formed. In an exemplary embodiment of the present inventive concept, the EUV light may be generated from high temperature plasma generated by irradiating a laser to a material, and thus the chamber may include a material which is not damaged by the high temperature plasma.

The material supplying unit may be disposed at an upper surface of the chamber. The material supplying unit may supply materials one by one to the internal space of the chamber, for example, in a vertical downward direction. The material may include tin, or a tin compound. A material control unit may control a location of the material supplying unit, so that the material accurately reaches the location of the laser irradiation. The material control unit may minutely move the material supplying unit along directions of the X-axis, Y-axis, and Z-axis.

The laser irradiating unit may be disposed at a left side surface of the chamber. The laser irradiating unit may irradiate the laser to the internal space of the chamber in a direction substantially perpendicular to the direction of material supply, for example, in a horizontal rightward direction. The laser irradiating unit may be disposed along a direction substantially perpendicular to the direction of material supplying unit. The laser may include a carbon dioxide laser.

A laser control unit may control the location of the laser irradiating unit so that the laser control unit accurately irradiates the laser, in a horizontal direction, to a material moving downward. The laser control unit may minutely move the laser irradiating unit along directions of the X-axis, Y-axis, and Z-axis.

The light collecting unit may collect the EUV light generated by irradiating the laser to a material. The light collecting unit may include a light collecting mirror, and/or a light collecting section. The light collecting mirror may be disposed between the laser irradiating unit and the location of laser irradiation in the chamber. The light collecting mirror may reflect the EUV light to the right side surface of the chamber. The light collecting unit may be disposed at the right side surface of the chamber. The EUV light reflected by the light collecting mirror may be collected by the light collecting unit.

A mirror control unit may control the location of the light collecting mirror so that the light collecting mirror accurately reflects the EUV light to the light collecting unit. The mirror control unit may adjust a reflection angle of the light collecting mirror so that the EUV light reflected by the light collecting mirror is accurately focused to the light collecting unit.

The guide unit may guide a material supplied by the material supplying unit to a location of laser irradiation. The guide unit may be disposed at a lower end of the material supplying unit which supplies the material. The guide unit may be parallel with the material supplying unit in a downward direction.

The illumination optical system 320 may be disposed at a side of the EUV light generating device 310. The illumination optical system 320 may transfer the EUV light generated by the EUV light generating device 310 to the reflective photomask 100.

The reflective photomask 100 described with reference to FIG. 6 may include elements substantially the same as the elements of the reflective photomask 100 described with reference to FIG. 1 and thus duplicative descriptions may be omitted. The reflective photomask 100 illustrated in FIG. 6 may be replaced with the reflective photomasks 200 or 300 described with reference to FIGS. 2 and 3, respectively.

The mask stage 330 may be disposed above the illumination optical system 320. The mask stage 330 may support the reflective photomask 100.

The projection optical system 340 may be disposed under the illumination optical system 320. The projection optical system 340 may transfer the EUV light reflected by the reflective photomask 100 to the wafer W.

The wafer stage 350 may be disposed under the projection optical system 340. The wafer stage 350 may support the wafer W.

Figure 7:
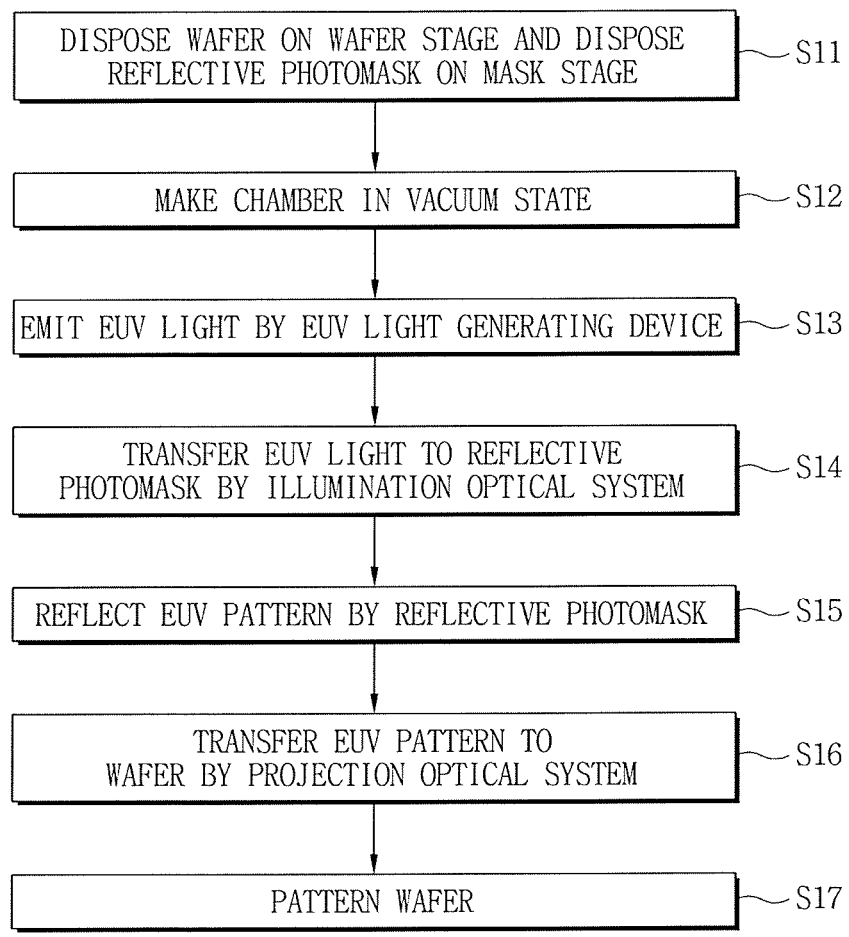
FIG. 7 is a flowchart illustrating operations of an exposure apparatus using a reflective photomask according to an exemplary embodiment of the present inventive concept.

FIG. 7 is a flowchart illustrating operations of an exposure apparatus using a reflective photomask according to an exemplary embodiment of the present inventive concept.

Referring to FIG. 7, in operation S11, a wafer W may be disposed on the wafer stage 350, and the reflective photomask 100 may be disposed on the mask stage 330.

In operation S12, a chamber may be in a vacuum state. A vacuum atmosphere may be formed in the chamber.

In operation S13, EUV light may be emitted by the EUV light generating device 310.

In operation S14, EUV light may be transferred to the reflective photomask 100 by the illumination optical system 320.

In operation S15, an EUV pattern may be reflected by the reflective photomask 100. The reflective photomask 100 may selectively reflect and absorb the EUV light to form the EUV pattern. The reflective photomask 100 according to an exemplary embodiment of the present inventive concept may spin coat a material of a spin coating type to form an absorbing layer, and thus relatively few particles may be included on the reflective layer 120, and the flatness of the reflective layer 120 may be increased and an accurate EUV pattern may be formed. When the reflective photomask 100 includes the capping layer 140, foreign materials might not be emitted from the reflective layer 120 or the absorbing layer 130, and thus the generation of particles in the exposure process may be reduced or eliminated.

In operation S16, an EUV pattern may be transferred to the wafer W by the projection optical system 340. The projection optical system 340 may transfer an EUV pattern reflected by the reflective photomask 100 to the wafer W seated on the wafer stage 350.

In operation S17, the wafer W may be patterned according to the EUV pattern.

According to some exemplary embodiments of the present inventive concept, the absorbing layer may be formed by spin coating, differential thermal curing, and wet etching, and thus a relatively high degree of surface flatness on a reflective surface of the EUV photomask may be maintained.

According to some exemplary embodiments of the present inventive concept, the absorbing layer may be formed by spin coating and wet etching, and thus, defects, such as a generation of particles on a reflective surface of the EUV photomask may be reduced or eliminated.

According to some exemplary embodiments of the present inventive concept, the absorbing layer may be formed by spin coating, and thus materials capable of absorbing the EUV light can be widely chosen and used.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A reflective photomask comprising:
a substrate;
a reflective layer formed on the substrate, wherein the reflective layer includes at least two recessed portions having different widths from each other along a direction parallel to an upper surface of the substrate; and
an absorbing layer formed in each of the at least two recessed portions, wherein the absorbing layer includes at least one absorbent and at least one polymer, and
wherein the polymer includes a compound having a structure in which a hydrogen atom of a phenolic hydroxyl group is replaced by a group having an arsenic acid-decomposable polycyclic type alicyclic hydrocarbon structure.

2. The reflective photomask of claim 1, wherein the at least one absorbent includes metallic particles.

3. The reflective photomask of claim 2, wherein the metallic particles include at least one selected from hafnium (Hf), tantalum (Ta), tungsten (W), aluminum (Al), and chromium (Cr).

4. The reflective photomask of claim 1, wherein the at least one absorbent includes a material which has an extinction coefficient (k) of about 0.02 or more among optical constants related to extreme ultraviolet light.

5. The reflective photomask of claim 1, wherein an upper surface of the absorbing layer formed in each of the at least two recessed portions is aligned with an upper level of each of the at least two recessed portions along the direction parallel to the upper surface of the substrate, and wherein a capping layer is formed on the reflective layer and on the absorbing layer.

6. The reflective photomask of claim 5, wherein the capping layer includes at least one selected from silicon (Si), molybdenum (Mo), ruthenium (Ru), and zirconium (Zr).

7. The reflective photomask of claim 1, further comprising a hard mask layer disposed on the reflective layer.

8. The reflective photomask of claim 7, wherein the hard mask layer includes ruthenium (Ru) or ruthenium silicon (RuSi).

9. The reflective photomask of claim 1, wherein the absorbing layer includes a surface which is thermally cured and wet etched.

10. An exposure apparatus, comprising:
an extreme ultraviolet (EUV) light generating device configured to generate and emit EUV light;
a reflective photomask, wherein the reflective photomask includes a substrate, a reflective layer comprising a plurality of recessed portions formed on the substrate, wherein the recessed portions of the plurality of recessed portions have different widths from each other along a direction parallel to an upper surface of the substrate, and an absorbing layer formed in each of the recessed portions of the plurality of recessed portions, wherein the absorbing layer includes an absorbent and a polymer;
an illumination optical system configured to direct the EUV light emitted from the EUV light generating device onto the reflective photomask; and
a projection optical system configured to direct the EUV light reflected from the reflective photomask onto a target object,
wherein the polymer includes a compound having a structure in which a hydrogen atom of a phenolic hydroxyl group is replaced by a group having an arsenic acid-decomposable polycyclic type alicyclic hydrocarbon structure.

11. The exposure apparatus of claim 10, wherein the absorbent includes a material which has an extinction coefficient (k) of about 0.02 or more among optical constants related to the EUV light.

12. The exposure apparatus of claim 10, wherein the reflective photomask further includes a capping layer disposed on the reflective layer and on the absorbing layer.

13. The exposure apparatus of claim 10, wherein the reflective photomask further includes a hard mask layer disposed on the reflective layer.

14. A reflective photomask comprising:
a substrate;
a reflective layer comprising a plurality of recessed portions disposed on the substrate, wherein the reflective layer comprises a plurality of layers, and wherein an uppermost layer of the plurality of layers of the reflective layer is a hard mask layer; and
an absorbing layer conformally formed in each of the recessed portions of the plurality of recessed portions, wherein a top surface of the absorbing layer and a top surface of the hard mask layer form a substantially continuous flat surface, wherein the absorbing layer includes an absorbent and a polymer, and wherein the polymer includes a compound having a structure in which a hydrogen atom of a phenolic hydroxyl group is replaced by a group having an arsenic acid-decomposable polycyclic type alicyclic hydrocarbon structure.

15. The reflective photomask of claim 14, further comprising a capping layer disposed on the substantially continuous flat surface.

16. The reflective photomask of claim 14, wherein the absorbent includes a material which has an extinction coefficient (k) of about 0.02 or more among optical constants related to extreme ultraviolet (EUV) light.

* * * * *